United States Patent
Nishio et al.

(10) Patent No.: US 6,565,419 B1
(45) Date of Patent: May 20, 2003

(54) METHOD OF REMOVING PARTICLES FROM STAGE AND CLEANING PLATE

(75) Inventors: Naoki Nishio, Toyko (JP); Kazushi Ishida, Tokyo (JP); Yukio Takigawa, Kawasaki (JP); Ei Yano, Kawasaki (JP)

(73) Assignees: Advantest Corporation, Tokyo; Fujitsu Limited, Kawasaki, both of (JP)

( * ) Notice: Subject to any disclaimer, the term of this patent is extended or adjusted under 35 U.S.C. 154(b) by 0 days.

(21) Appl. No.: 09/497,819

(22) Filed: Feb. 3, 2000

(30) Foreign Application Priority Data

Feb. 5, 1999 (JP) .......................................... 11-029054

(51) Int. Cl.⁷ ................................................ B24B 1/00

(52) U.S. Cl. ......................................... 451/28; 451/444

(58) Field of Search .............................. 451/28, 29, 30, 451/56, 41, 364, 397, 398, 444

(56) References Cited

U.S. PATENT DOCUMENTS

| | | | |
|---|---|---|---|
| 4,510,640 A | | 4/1985 | Omori |
| 5,386,430 A | * | 1/1995 | Yamagishi et al. ............ 372/57 |
| 5,690,749 A | * | 11/1997 | Lee .............................. 134/26 |
| 5,807,658 A | * | 9/1998 | Ellis et al. .................... 430/302 |
| 5,874,365 A | * | 2/1999 | Tomita et al. ................. 216/46 |
| 5,902,678 A | | 5/1999 | Konda et al. |
| 6,030,751 A | * | 2/2000 | Ellis et al. .................... 430/302 |
| 6,071,801 A | * | 6/2000 | Wachtler et al. ............. 438/612 |
| 6,095,900 A | * | 8/2000 | Fruitman et al. .............. 451/41 |
| 6,106,369 A | * | 8/2000 | Konishi et al. ................ 451/11 |
| 6,117,797 A | | 9/2000 | Hembree |
| 6,120,361 A | * | 9/2000 | Konishi et al. .............. 451/287 |
| 6,251,542 B1 | * | 6/2001 | Tomita et al. ................. 134/1.3 |
| 6,425,810 B2 | * | 7/2002 | Komuro ..................... 451/289 |

FOREIGN PATENT DOCUMENTS

| | | |
|---|---|---|
| DE | 81 048 | 9/1969 |
| DE | 78 12 733 | 4/1978 |
| JP | 1-95010 | 4/1989 |
| JP | 6-165975 | 6/1994 |
| JP | 07074137 A | * 3/1995 |
| JP | 9-178806 | 7/1997 |
| JP | 9-293740 | 11/1997 |
| JP | 11-19946 | 1/1999 |
| JP | 2000-108159 A | 4/2000 |
| JP | 2001-77011 | 3/2001 |

OTHER PUBLICATIONS

Translation of a portion of a Preliminary Rejection Notice issued on the related Korean application, with the cited US reference.
Australian Search Report, dated Jan. 7, 2002 for related application.
Australian Patent Office Written Opinion, dated Jan. 24, 2002 for related application.

* cited by examiner

*Primary Examiner*—Derris H. Banks
(74) *Attorney, Agent, or Firm*—Christie, Parker & Hale, LLP (57) ABSTRACT

Disclosed is a method of readily removing particles from a stage, that is, a stage particle removing method for removing particles from a stage that holds a planar workpiece. A resin film is placed on the stage, and collected from the stage. The resin film is coated over at least one surface of the planar workpiece such as a semiconductor wafer or glass substrate. The resin film is brought into contact with the stage. The resin film may not be coated over the planar workpiece itself but may be coated over a dedicated planar piece shaped similarly to the planar workpiece, for example, a thin metallic plate that is very smooth. The used resin film is peeled off from the planar workpiece or dedicated planar piece, and the resin film is coated again. Thus, the planar workpiece or dedicated planar piece can be reused.

12 Claims, 7 Drawing Sheets

| EXAMPLE | 1 | 2 | 3 | 4 | 5 | 6 | 7 | 8 |
|---|---|---|---|---|---|---|---|---|
| HARDNESS OF ELASTOMER | 1 | 10 | 30 | 50 | 75 | 100 | 101 OR MORE | - |
| NUMBER OF REMAINING PARTICLES | 0 | 0 | 0 | 0 | 0 | 0 | 10 | 5 |

METHOD OF REMOVING PARTICLES FROM STAGE AND CLEANING PLATE

BACKGROUND OF THE INVENTION

1. Field of the Invention

The present invention relates to a particle removing method for removing particles (dust) from a stage that holds a planar workpiece such as a semiconductor wafer, and a cleaning plate used according to the method.

2. Description of the Related Art

For processing or machining a planar workpiece (plate-like piece), normally, the plate-like piece is held on a stage having a flat placement surface. For example, during an electronic part manufacturing process for processing or machining a semiconductor wafer, the semiconductor wafer is locked or held on the stage according to a suction method by electrostatic force or vacuum suction method. The semiconductor wafer is held or locked on the stage during such processes as follows: a lithography process using a step-and-repeat photolithography system with demagnification or an electron-beam lithography system; a film handling process using a sputtering system, a deposition system, a chemical vapor deposition (CVD) system, and an etching system; an electric testing process for testing dies (chips) delineated on a semiconductor wafer using a prover and a tester; and a process for optically inspecting patterns drawn on a semiconductor wafer. Moreover, for manufacturing a panel for a liquid crystal display or plasma display, a glass substrate is locked or held on a stage in order to carry out various kinds of processing including patterning. A stage for holding a semiconductor wafer during the lithography process will be taken for instance in order to proceed to a further description. The present invention is not limited to this sort of stage. The present invention can be applied to any stage as long as the stage holds a planar workpiece (plate-like piece) for precise processing or machining.

Figure 1:
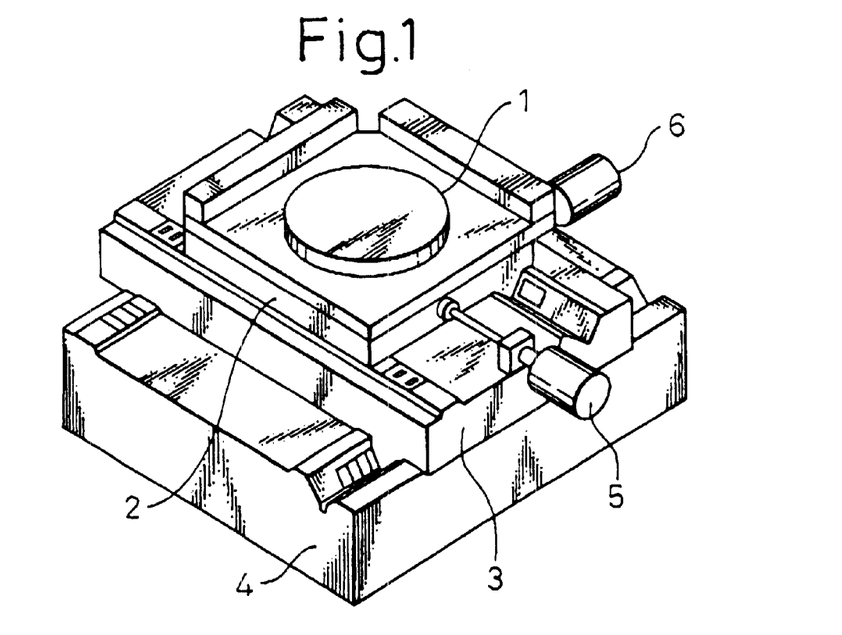
FIG. 1 schematically shows a prior art example of structures of a stage and its moving mechanism employed during a lithography process for manufacturing semiconductor devices.

FIG. 1 shows the basic structure of a wafer stage employed during the lithography process or the like. In FIG. 1, a stage 1 holds and locks a semiconductor wafer on the top thereof, and is placed on a Y-direction movable base 2. The Y-direction movable base 2 is supported to be movable in a Y direction along movement grooves bored in an X-direction movable base 3. The Y-direction movable base 2 moves in the Y direction when driven by a DC servomotor 5. The X-direction movable base 3 is supported to be movable in an X direction along movement grooves bored in a base 4, and moves in the X direction when driven by a DC servomotor 6. Owing to this mechanism, the stage 1 is movable in the two, X and Y, directions. In practice, the stage 1 is movable in Z directions or vertical directions. A laser interferometer or the like for precisely measuring a magnitude of movement is included in the stage but is omitted herein.

Figure 2:
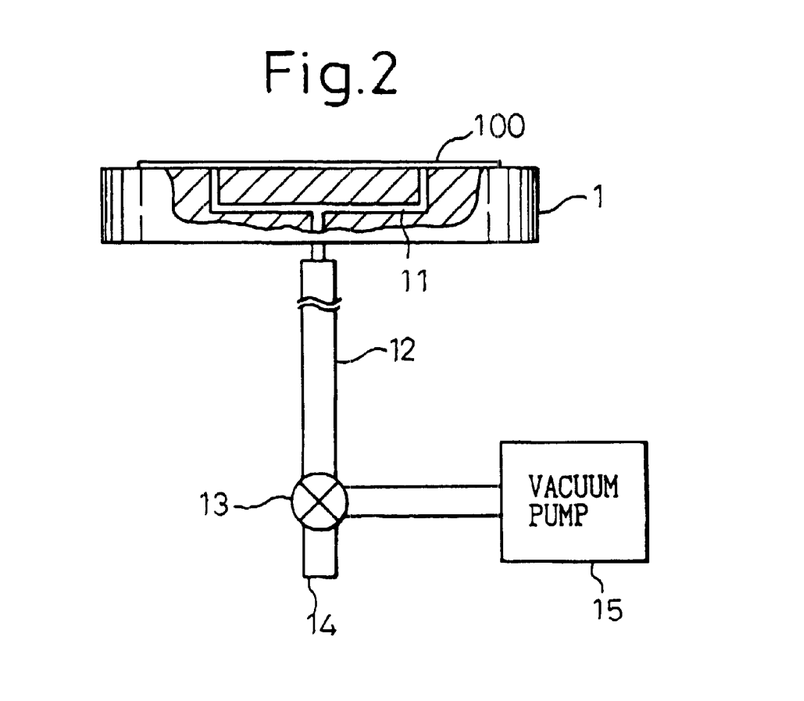
FIG. 2 schematically shows a prior art vacuum suction mechanism for sucking the stage.

For holding and locking a placed semiconductor wafer, a vacuum suction method or a suction method by electrostatic force is adopted. FIG. 2 shows the schematic structure of a vacuum suction mechanism included in the wafer stage. As shown in FIG. 2, a plurality of holes is bored in the top of the stage 1 and communicating with a connection port via an air path 11 formed inside the stage 1. The connection port is linked to a vacuum pump 15 by way of a hose 12 and an air valve 13. After a semiconductor wafer 100 is placed on the top of the stage 1, the air valve 13 is turned to select the vacuum pump 15. This causes the vacuum pump 15 to operate (the vacuum pump is connected to a vacuum chamber). The interior of the air path 11 is depressurized accordingly. The semiconductor wafer 10 is then sucked onto the top of the stage 1 and locked. For collecting the semiconductor wafer 100 from the stage 1, the air valve 13 is turned to select an exhaust path 14. Outside air is introduced into the air path 11. Consequently, the semiconductor wafer is freed from the vacuum suction mechanism. Thereafter, a vertical movement pin, which is not shown, formed on the stage 1 is moved upward. With the semiconductor wafer 100 thus moved upward, a wafer transportation mechanism receives the semiconductor wafer. For placing the semiconductor wafer 100 on the top of the stage 1, the vertical movement pin is moved upward. In this state, the wafer transportation mechanism places the semiconductor wafer 100 on the vertical movement pin. After the wafer transportation mechanism withdraws, the vertical movement pin is moved downward. Consequently, the semiconductor wafer 100 is placed on the stage.

The foregoing vacuum suction mechanism is widely adopted as a suction mechanism for wafer stages. However, in a system in which a semiconductor wafer and a stage are held in a vacuum (depressurized) environment, such as an electron-beam lithography system, the vacuum suction mechanism is unusable. A suction mechanism utilizing static electricity is adopted.

Semiconductor devices have been considerably downsized in recent years. The occurrence of microscopic particles (dust) during a semiconductor manufacturing process greatly affects a yield of semiconductor devices. In general, the semiconductor manufacturing process is carried out in a very clean environment, or more particularly, in a clean room. Especially a lithography process for manufacturing semiconductor devices is required to achieve highly precise processing and is therefore carried out in a clean room of the highest level of cleanness. However, even when the processing is carried out in such an environment, it is impossible to perfectly prevent occurrence of particles. A decrease in the yield caused by adhesion of particles onto the top of a semiconductor wafer has been discussed mainly in the past. A method of removing particles from the air circulated within a clean room using a filter or the like has been adopted in the past. The standard stipulating the degree of cleanness of a clean room describes the number of particles existing in the air.

However, particles not floating in the air but adhering to the surface of a stage may be scattered into the air during placement or collection of a semiconductor wafer. It is highly possible that the particles may adhere to the surface of another semiconductor wafer and become a factor of the decrease in the yield. It is relatively small particles that may be scattered into the air during placement or collection of a semiconductor wafer. Such particles are scattered into the air during collection of a semiconductor wafer, and a semiconductor wafer to be exposed next is then supplied immediately thereafter. There is therefore a high possibility that the scattered particles may adhere to the surface of the next semiconductor wafer. This greatly affects the yield.

Figure 3A:
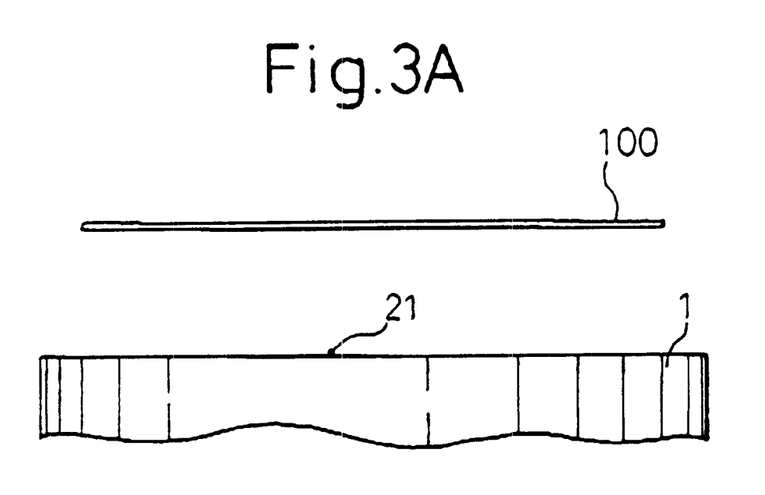
FIG. 3A and FIG. 3B are explanatory prior art diagrams concerning a trouble occurring when a particle adheres to the surface of the stage.
Figure 3B:
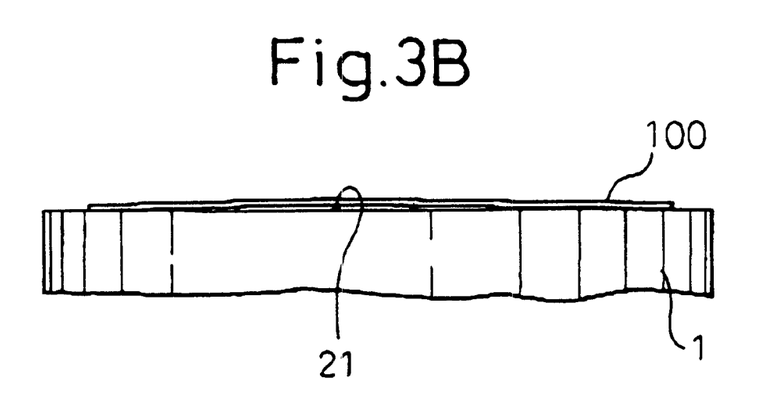

Moreover, relatively large particles are less likely to scatter than small particles. However, when a semiconductor wafer is placed on the surface of a stage to which the large particles adhere, if the semiconductor wafer is duly sucked, the flatness of the semiconductor wafer deteriorates due to the particles. FIG. 3A and FIG. 3B show this condition. When the semiconductor wafer 100 is placed on the stage 1 having a particle 21 and is sucked as shown in FIG. 3A, the part of the semiconductor wafer lying on the particle 21 is higher than the other part thereof. This leads to deteriorated flatness. Besides, the semiconductor wafer 100 is deformed around the particle 21 during suction. If the particle is small enough, the deterioration in the flatness of the semiconductor wafer or the deformation thereof is negligible. For this reason, almost no measures have been taken to remove particles adhering to the surface of a stage.

However, semiconductor devices have been getting smaller in recent years. A numerical aperture (NA) offered by the step-and-repeat photolithography system with demagnification has reached 0.5 or more. Since a depth of focus is very small (shallow), even a small decrease in the flatness causes trouble. Moreover, the electron-beam lithography system offers a larger depth of focus than the step-and-repeat photolithography system with demagnification. The decrease in the flatness is manifested as a positional deviation. Besides, patterns drawn by the electron-beam lithography system are finer than those drawn by the step-and-repeat photolithography system with demagnification. Therefore, the effect of particles adhering to a stage cannot be ignored any longer.

As mentioned above, almost no measures have been taken to remove particles adhering to the surface of a stage. In general, for removing particles adhering to the surface of an apparatus, the surface is washed using pure water or any other fluid, wiped out using a cleaning cloth, or blown out with an air flow. However, since the stage is mounted on an apparatus, it cannot be washed using a fluid. If the surface of the stage were wiped out using a cleaning cloth or blown out with an air blow, particles would be scattered within the apparatus. This work causes new particles to appear.

In particular, as far as an electron-beam lithography system or a film handling system such as the sputtering system, deposition system, CVD system, or etching system is concerned, the stage must be placed in a depressurized state or in a predetermined gaseous atmosphere. When an attempt is made to remove particles from the stage according to the foregoing method, the atmosphere in which the stage is placed must be changed to the air. This leads to a decrease in the operating rate of the system, and causes adhesion of new particles to the stage.

Particles are attributable to contact between a semiconductor wafer and the surface of the stage or contact between the vertical movement pin and the semiconductor wafer, and grow from the surfaces of the stage and semiconductor wafer. Moreover, particles falling off from a semiconductor wafer supplied from outside a system for processing or particles floating in the atmosphere of the system are thought to adhere to semiconductor wafers. Particles adhering to the surface of the stage may be transported out of a system while adhering to the surface of a semiconductor wafer during supply or collection of the semiconductor wafer, or may be scattered into the other portion of the system or into the air. Unless particles are removed by performing thorough cleaning, particles would accumulate and the number of particles would increase. As mentioned above, once a stage is mounted in a system, it is hard to clean the stage. It is by no means easy to remove particles from the stage.

SUMMARY OF THE INVENTION

As mentioned above, the removed of particles on a stage has not been discussed very seriously. It is hard to remove particles. However, along with the further advancement of a microprocessing technology, removing particles from a stage has become important for improving the yield. An object of the present invention is to establish a method of readily removing particles from a stage and to improve a yield by removing particles without substantially causing a decrease in an operating rate according to the method.

For accomplishing the above object, a method of removing particles from a stage according to the present invention is such that a resin film is placed on a stage and then collected therefrom after particles adhere thereto. Thus, the particles are removed from the stage.

In other words, a method of removing particles from a stage according to the present invention is a stage particle removing method for removing particles from a stage that holds a planar workpiece when implemented in a system for processing or machining the planar workpiece. The method is characterized in that a resin film is placed on the stage and then collected from the stage.

The resin film is less hard and more elastic than a ceramic made into the stage or a metal. More particles are likely to adhere to the resin film than to the surface of the stage. Therefore, when the resin film is placed on the stage to which particles adhere, the particles stick to the resin film. When the resin film is collected, almost all the particles are collected while adhering to the resin film. According to this method, since particles are collected while adhering to the resin film, there is no fear that the particles may be scattered into the air or stuck to any other part.

The resin film may be realized as a planar plate formed with a resin film alone. Preferably, the resin film should be coated over at least one surface of a planar workpiece such as a semiconductor wafer or glass substrate, and the planar workpiece should then be placed with the resin film side thereof in contact with the stage. Moreover, the resin film may not be coated over the planar workpiece itself but may be coated over a dedicated planar piece that is shaped similarly to the planar workpiece, for example, a thin metallic plate that is quite smooth. In this case, particles can be removed from the stage by utilizing the same supply/discharge route as that along which the planar workpiece is supplied or discharged. Particles can therefore be removed efficiently and quickly. Moreover, the used resin film should preferably be peeled off from the planar workpiece or dedicated planar piece, and the planar workpiece or dedicated planar piece should be reused by being recoated with another resin film For enabling automatic transportation of the resin film or removing particles highly efficiently, the resin film must be very flat. A difference in film thickness should preferably be 100 $\mu$m or less. More preferably, the difference should be 20 $\mu$m or less. Herein, the resin film or the plate-like piece coated with the resin film shall be referred to as a cleaning plate.

The present invention can be implemented in any system as long as the system includes a stage for holding and locking a planar workpiece. When implemented especially in a semiconductor manufacturing system for processing or machining a semiconductor wafer that is susceptible to particles, the present invention proves most advantageous.

The hardness of the resin film should preferably be of a level permitting the resin film to deform readily when meeting a particle and permitting the particle to adhere to the resin film.

The resin film is produced by, for example, applying a resin directly to the planar workpiece or dedicated planar piece according to a screen printing method, and then hardening it. Otherwise, a resin is molded into the state of a film according to any of various molding methods.

Before use, the resin film must be retained in a state in which few particles adhere to the resin film. The resin film must therefore be cleaned using a solvent such as alcohol, acetone, or isopropyl alcohol. For this reason, for example, an acrylic rubber, a butadiene rubber, a styrene rubber, a nitryl rubber, or a silicone resin such as a silicone elastomer or a silicone rubber that is durable to the solvent should preferably be adopted. A crosslinked (addition) resin and a condensation resin are known as silicone rubbers (elastomers). Preferably, the silicone rubber of the crosslinked (addition) resin that is little contracted and evaporated when hardened should be adopted.

As mentioned above, the resin film may be produced by applying a resin directly to a wafer or the like according to a screen printing technique or the like and then hardening it. Alternatively, a resin film produced as an independent film may be bonded to a wafer using an adhesive afterward. The adhesive may be a silicone adhesive or an epoxy adhesive but is not restricted to any specific one. Any adhesive will do as long as the adhesive exerts a predetermined bonding strength.

The film should preferably contain a filler or an additive such as a pigment. For fear of secondary contamination by the film, the filler should be perfectly covered with a resin, or in other words, the filler should not be exposed, by itself, on the surface of the film.

For preventing the filler from being exposed, the surface of the filler is finished using a coupling material or a primer. Thus, the wettability of the surface of the filler in contact with a resin should be improved.

When a collected resin film is cleaned using a solvent, if the resin film can be restored to the original state in which the resin film has few particles, the resin film is cleaned and then reused.

Assuming that the stage has a vacuum suction mechanism or a suction mechanism by electrostatic force, after the resin film is placed on the stage, the resin film should preferably be sucked, freed, and then collected. Thus, particles can be reliably stuck to the resin film. As mentioned above, the stage included in the electron-beam lithography system may be placed in a depressurized environment. In this case, the suction mechanism by electrostatic force is adopted.

BRIEF DESCRIPTION OF THE DRAWINGS

The feature and advantages of the invention will be more clearly understood from the following description taken in conjunction with the accompanying drawings, in which.

DESCRIPTION OF THE PREFERRED EMBODIMENT

A description will be made of an embodiment in which the present invention is applied to removale of particles from a stage included in an electron-beam lithography system. However, the present invention is not limited to this mode.

The electron-beam lithography system is a system for irradiating an electron beam to a semiconductor wafer (or substrate) to which a resist is applied, and drawing desired patterns on the semiconductor wafer. The electron-beam lithography system is characterized in that it can draw finer patterns than the step-and-repeat photolithography system with demagnification can. When one thin beam is used to draw patterns, it takes a long time for exposure. For improving a throughput, various methods including a variable rectangular lithography method, a block lithography method, and a multi-beam lithography method have been proposed. The present invention can be implemented in any of the methods. The configuration of the electron-beam lithography system will be described briefly by taking the block lithography method for instance.

Figure 4:
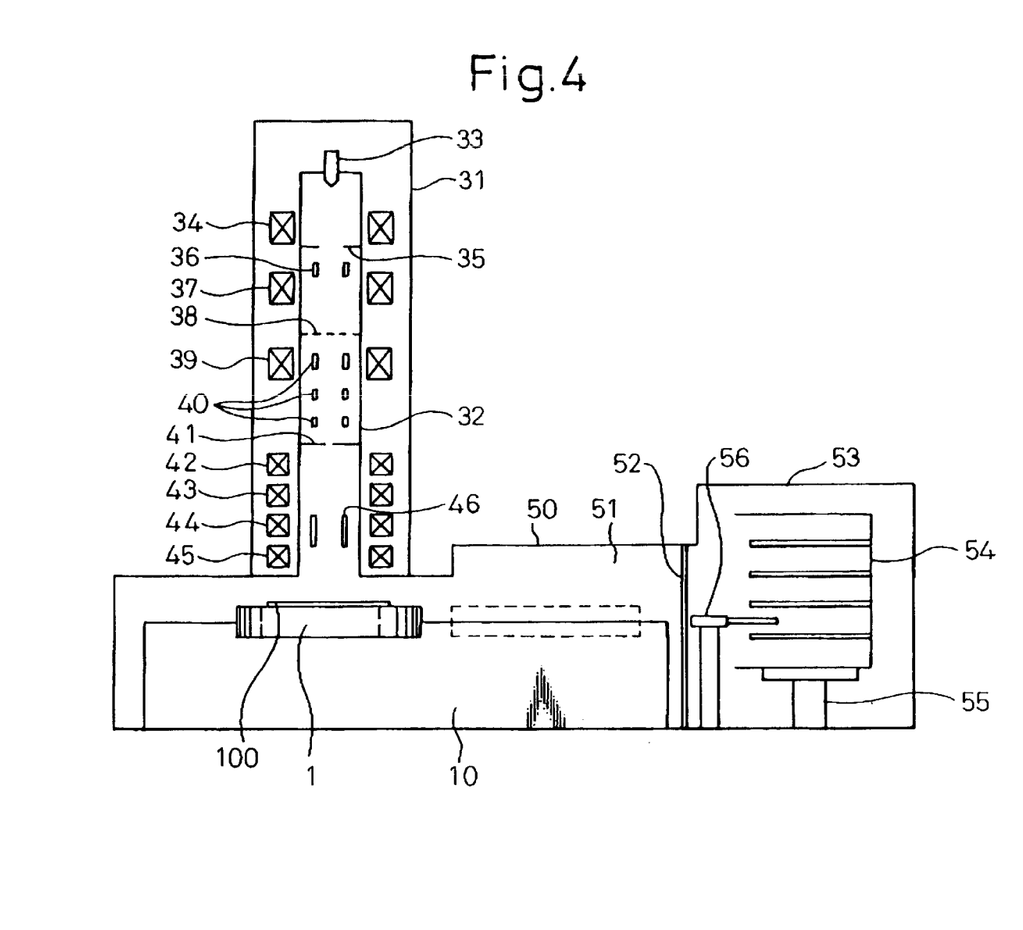
FIG. 4 shows the configuration of an electron-beam lithography system employed in an embodiment of the present invention.

FIG. 4 shows the configuration of a beam irradiation system included in an electron-beam lithography system adopting the block lithography method. The block lithography method is such that: patterns serving as units of a repetitive graphic are drawn on a transparent mask; an electron beam is propagated into the transparent mask in order to draw unit patterns at a time; and the unit patterns are linked to draw the repetitive graphic. An electron beam shot from an electron gun 33 is accelerated and then collimated into a parallel-ray beam by an electromagnetic lens 34. Thereafter, the beam is passed through a first slit 35 and thus reshaped. A desired one of patterns drawn on a transparent mask 38 is selected, and the beam is propagated into the selected pattern portion of the transparent mask 38 using an electrostatic deflector 36 and an electromagnetic lens 37. The beam may or may not be passed through a blanking aperture 41 using an electromagnetic lens 39 and an electrostatic deflector 40, whereby the beam is validated or invalidated. The beam is then deflected using electromagnetic lenses 42 to 45 and an electrostatic deflector 46 on the fourth stage. The beam is then irradiated to a desired position. In reality, coils and pole pieces are included for constituting the electromagnetic lenses designed for convergence. The coils and pole pieces are not shown in FIG. 4. The above components are stowed in a housing referred to as a column 31. The interior of the column through which the electron beam passes is depressurized using a vacuum seal 32. The components are well known and have nothing to do with the present invention. A further description will be omitted.

A stage 1 and a stage moving mechanism 10 are installed below the column 31. The stage 1 and stage moving mechanism 10 are stowed in a depressurized vacuum booth 51 within a vacuum chamber 50. The vacuum booth 51 is communicating with a depressurized portion of the column partitioned with a vacuum seal 32. The stage 1 and stage moving mechanism 10 have the basic structures shown in FIG. 1. Since the stage 1 and stage moving mechanism 10 are used in the pressurized vacuum booth 51, the stage 1 is designed to hold and lock a semiconductor wafer 100 according to the suction method by electrostatic force.

Figure 5:
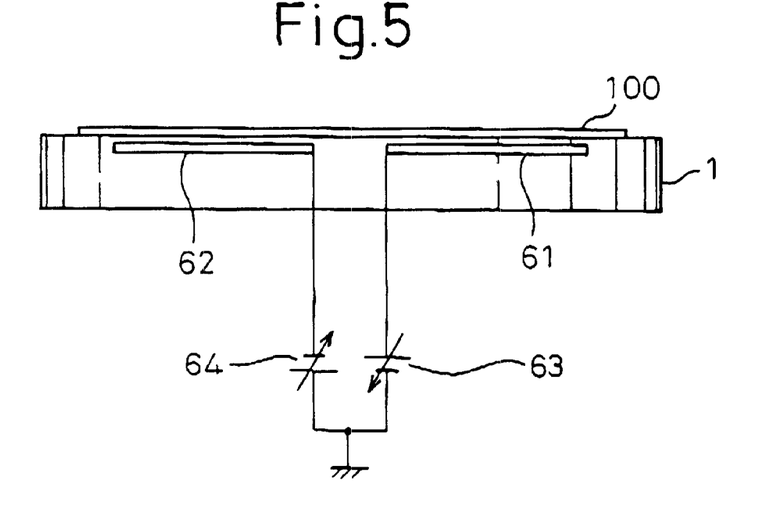
FIG. 5 is an explanatory diagram concerning the basic structure of a suction mechanism by electrostatic force adopted for a stage included in the electron-beam lithography system employed in the embodiment.

FIG. 5 shows the basic structure of the stage 1 for holding and locking the semiconductor wafer 100 according to the suction method by electrostatic force. As illustrated, two electrodes 61 and 62 are extending along the top of the stage 1 inside the stage 1 which is made of a dielectric material. High voltages of opposite polarities are applied from voltage sources 63 and 64 to the electrodes. Accordingly, charges are induced in the placed semiconductor wafer 100, and attracting forces are generated. The semiconductor wafer 100 is sucked with a force of 100 kgf. Similarly to when the vacuum suction method is adopted, a vertical movement pin is included but not shown in FIG. 5.

Referring back to FIG. 4, the stage 1 receives the unexposed semiconductor wafer 100 from a wafer cassette 54. For returning the semiconductor wafer 100 that has been exposed to the wafer cassette 54, the stage 1 is moved to a loading/unloading position indicated with a dashed line. A cassette chamber 53 in which the wafer cassette 54 is stowed and the vacuum booth 51 are separated from each other with a partition 52 that can be opened or closed. For putting the wafer cassette 54 in the cassette chamber 53 or for collecting the wafer cassette from the cassette chamber 53, the partition 52 is closed in order to bring the cassette chamber 53 to the same normal pressure state as the outside. Thereafter, the door of the cassette chamber 53 is opened in order to take out or put the wafer cassette 54. When setting the wafer cassette 54 is completed, the door of the cassette chamber 53 is closed in order to depressurize the interior. After the cassette chamber 53 is returned to a predetermined state, the partition 52 is opened. In this state, the unexposed semiconductor wafer 100 is extracted from the wafer cassette 54 using a transportation arm 56, and then placed on the stage 1 located at the position indicated with the dashed line. The semiconductor wafer is then sucked according to the suction method by electrostatic force, thus locked, and transported to an exposure position.

When exposure is completed, the stage is moved again to the position indicated with the dashed line. The exposed semiconductor wafer 100 is returned to the wafer cassette 54 by reversing the route. The wafer cassette 54 is moved using a vertical movement mechanism 55 for moving the cassette 54. Another new semiconductor wafer 100 is placed on the stage 1. This sequence is repeated until exposure of all semiconductor wafers 100 in the wafer cassette 54 is completed. When exposure of all semiconductor wafers 100 in the wafer cassette 54 is completed, the partition 52 is closed as mentioned above and the wafer cassette 54 is taken out and another put in.

In the electron-beam lithography system, semiconductor wafers are supplied and discharged using the foregoing structure. Once a particle adheres to the stage 1, it is by no means easy to remove the particle.

Figure 6A:
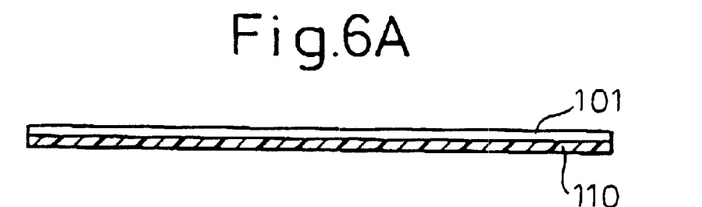
FIG. 6A and FIG. 6B show the structure of a cleaning wafer employed in the embodiment.
Figure 6B:
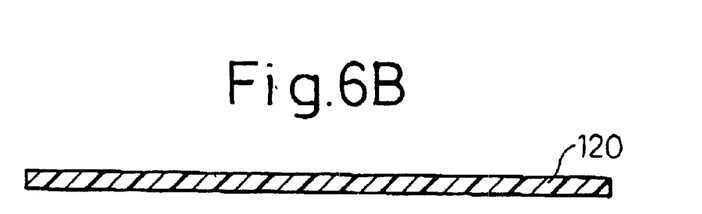
Figure 7:
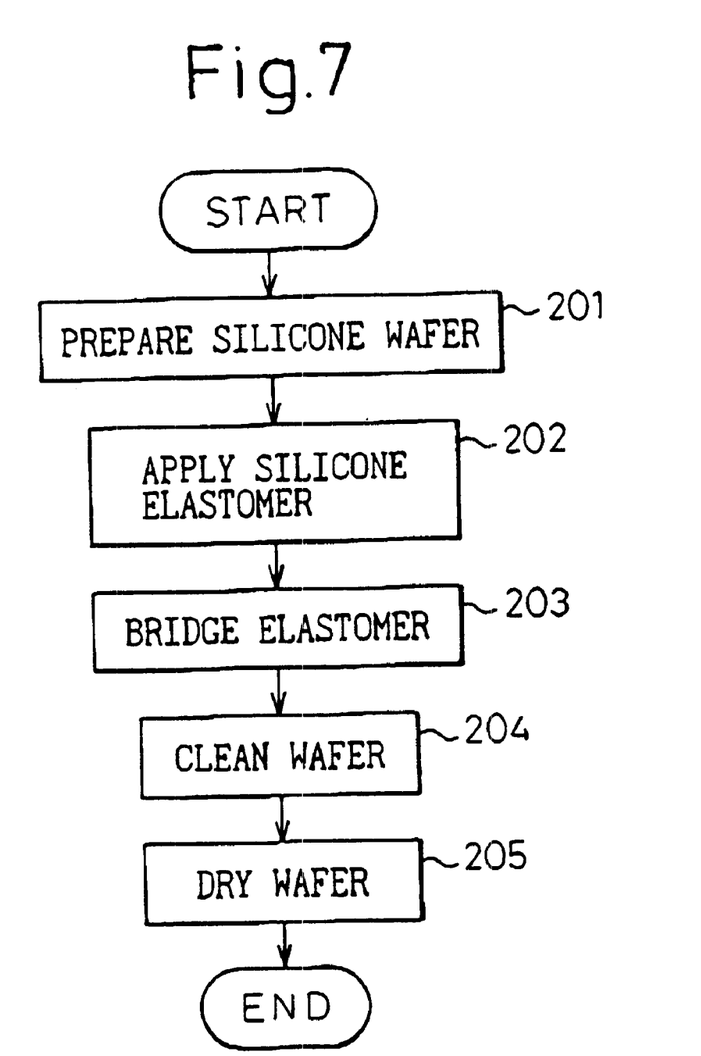
FIG. 7 is a flowchart describing a method of manufacturing the cleaning wafer.

In this embodiment, for removing a particle stuck to the stage 1, a cleaning wafer (cleaning plate) shown in FIG. 6A and FIG. 6B is employed. FIG. 6A shows an example of cleaning wafers made by coating a resin film over one side of a semiconductor wafer. FIG. 7 is a flowchart describing a sequence of producing the cleaning wafer shown in FIG. 6A. Referring to FIG. 7, the cleaning wafer shown in FIG. 6A will be described.

At step 201, a semiconductor wafer 101 having the same shape as the semiconductor wafer 100 to be exposed and having been washed is prepared. According to this embodiment, a silicon wafer 101 of 8 inches (approximately 200 mm) in diameter and 700 μm in thickness is employed. At step 202, a double-fluid hard silicone elastomer is applied to one side of the semiconductor wafer 101. At step 203, the silicone elastomer is bridged in order to produce a resin film layer 110 of 200 μm thick. At step 204, the semiconductor wafer 101 having the resin film layer 110 formed thereon is immersed in an ultrasonic cleaning vessel filled with acetone and ultrasonically cleaned. At step 205, the semiconductor wafer 101 is dried. This results in a cleaning wafer.

Instead of the semiconductor wafer 101, a resin film layer may be formed on a metallic plate in order to produce the cleaning wafer shown in FIG. 6A. Thus, a planar resin plate 120 having the same diameter as the S semiconductor wafer like the one shown in FIG. 6B may be employed. However, since the transportation mechanism for transporting semiconductor wafers is utilized for transportation, the hardness of the resin plate cannot be lowered very greatly. Moreover, the thickness thereof is limited to a certain value. A material and shape meeting these conditions should be determined.

A sequence of removing particles from the top of the stage 1 using the cleaning wafer shown in FIG. 6A will be described with reference to FIG. 8. is At step 211, a cleaning wafer like the one shown in FIG. 6A is set in the wafer cassette 54. The number of cleaning wafers depends on the degree to which particles should be removed. Namely, one cleaning wafer or a plurality of cleaning wafers will do. At step 212, the wafer cassette 54 is set with the partition 52 closed. The cassette chamber 53 is depressurized, and then the partition 52 is opened. At step 213, the stage 1 is moved to the position indicated with the dashed line in FIG. 4. The wafer transportation arm 56 is used to place a cleaning wafer on the stage 1 with the resin film layer of the cleaning wafer facing down. At step 214, the cleaning wafer is sucked for ten seconds according to the electrostatic cling method described in conjunction with FIG. 5, and thus brought into close contact with the stage 1. As mentioned above, the suction method by electrostatic force in accordance with this embodiment exerts a suction force of 100 kgf. The suction force and suction time should be set to optical values according to various conditions. For example, the suction force may be 10 kgf. Nevertheless, particles can be removed to a desired extent. At step 215, suction is terminated and the cleaning wafer is returned to the wafer,cassette 54. The partition 52 is closed and the cassette chamber 53 is returned to the normal-pressure state. When a plurality of cleaning wafers is set in the wafer cassette 54, the above sequence is repeated for all the plurality of cleaning wafers stowed in the wafer cassette 54. The partition 52 is then closed and the cassette chamber 53 is returned to the normal-pressure state. Whether particles can be removed depends on various conditions including the size and weight of particles, the suction force, and the hardness of the resin film. The conditions cannot be determined uniquely. Whether particles can be removed is a question of a probability. From this viewpoint, if the plurality of identical cleaning wafers is used to repeat the above sequence a plurality of times, the probability of removal of particles will improve.

At step 216, the wafer cassette 54 is collected and the cleaning wafer is taken out. The wafer cassette 54 is cleaned and then reused. The work of removing particles from the stage is completed according to the foregoing sequence. The electron-beam lithography system is returned to a normal processing mode. The time required from step 211 to step 216 is very short. The collected cleaning wafer is reproduced at step 217. Reproduction is such that after the resin film layer 110 is peeled off, the semiconductor wafer 101 is cleaned, and then the resin film layer 110 is formed again according to the sequence described in FIG. 7.

Removale of particles from the stage according to the foregoing sequence is carried out, for example, after a predetermined number of semiconductor wafers has been handled, periodically, or any time when a defect is detected after an exposure process. When particles are removed every after a predetermined number of semiconductor wafers has been handled, one of the wafers to be exposed and stored in the wafer cassette 54 is used as the cleaning wafer. The foregoing sequence is then performed on the cleaning wafer in order to clean the stage.

The extent to which particles are removed from the stage was checked when some of the parameter of this embodiment were changed. The results of the checking will be described. A non-contact type surface roughness tester capable of detecting a silicon fragment was put in the vacuum booth 51 in advance. One hundred silicon fragments 10 $\mu$m long were uniformly scattered and stuck to the stage 1. Cleaning wafers had their resin film layers 110 made of a silicone elastomer whose hardness was set to 1, 10, 30, 50, 75, 100, and 101 or more respectively using a JIS-A hardness meter (JIS K 6301). The cleaning wafers were used to remove particles from the stage 1 according to the aforesaid method of the embodiment. The number of remaining particles was measured using the non-contact type surface roughness tester. The results of the measurement are listed as examples 1 to 7 in FIG. 9. When the hardness is equal to or smaller than 100, the number of remaining particles is zero. When the hardness exceeds 100, particles of 10% remain. Consequently, the hardness of the resin film layer should preferably be equal to or smaller than 100.

Figure 9:
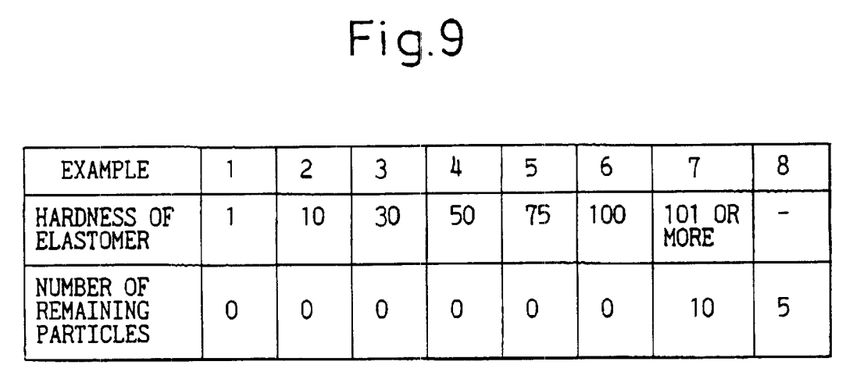
FIG. 9 is a table listing the degrees by which particles are removed when a condition is varied according to the embodiment of the present invention, and the degrees by which particles are removed when another cleaning method is adopted, thus describing the advantages of the present invention.

Moreover, an example 8 in FIG. 9 specifies the results of measurement performed by installing the electron-beam lithography system in a clean room of class 1. The surface of the stage 1 is sucked using a vacuum cleaner with the wafer cassette 54 and partition 52 left open. Immediately thereafter, the partition 52 is closed in order to bring the vacuum booth 51 into a vacuum. Namely, five particles were left. However, the lengths of the detected particles are equal to or smaller than 2 $\mu$m. According to the method of removing particles from the stage 1 using a vacuum cleaner, the stage 1 is presumably contaminated secondly with particles emitted from the vacuum cleaner. Particles cannot therefore be removed perfectly.

As described above, according to this embodiment, the mechanism for supplying or discharging a semiconductor wafer which is conventionally included in the electron-beam lithography system is used to remove particles from the stage nearly perfectly in a short period of time.

A description has been made of an embodiment in which the present invention is implemented in an electron-beam lithography system. Alternatively, the present invention can be implemented in a step-and-repeat photolithography system with demagnification. Since the step-and-repeat photolithography system with demagnification is required to offer as high precision as is that the electron-beam lithography system is, the present invention would provide great advantages. Moreover, when the present invention is implemented in a semiconductor manufacturing system that is not required to offer so high precision as the lithography systems are, particles can be removed without being scattered. The number of particles adhering to the surface of a semiconductor wafer can be decreased. Beside, particles adhering to the back of a semiconductor wafer and being moved to another process line, for example, a lithography line can be diminished. This contributes to improvement of a yield offered by the system.

Moreover, as far as any system other than the semiconductor manufacturing system is concerned, there is no effective method for removing particles from the surface of the stage, which holds and locks a planar workpiece, without scattering them. When the present invention is implemented in such a system, particles can be removed without affecting other components adversely. For example, the present invention may be implemented in a system for manufacturing a panel for a liquid-crystal display or a plasma display. In this case, since a glass substrate is held and locked on a stage included in the system, a resin film layer is formed on the same glass substrate or a similar metallic plate in order to produce a cleaning plate.

As described so far, according to the present invention, particles can be removed from a stage without scattered. The adverse effect of particles can be reduced drastically.

In particular, when the present invention is implemented in a semiconductor manufacturing system, particles on a stage which may deteriorate the flatness of a semiconductor wafer and scatter to adversely affect the surface of a semiconductor wafer can be removed without scattered. Consequently, the yield of a semiconductor manufacturing process improves greatly.

What is claimed is:

1. A stage particle removing method for removing particles on a surface of a stage, which holds a planer workpiece, when implemented in a system for processing the planar workpiece, comprising:

placing a cleaning plate, which is rigid and includes a resin film coated over at least one surface of the rigid cleaning plate, on the surface of said stage to contact the resin film with the carrying surface of said stage and any particles on the surface of said stage so the particles adhere to the resin film coating; and withdrawing said rigid cleaning plate from said stage to remove particles from said stage.

2. A stage particle removing method according to claim 1, wherein said cleaning plate has a same shape as the planer workpiece.

3. A stage particle removing method according to claim 1, wherein said system is a semiconductor manufacturing system, and wherein said workpiece is a semiconductor wafer.

4. A stage particle removing method according to claim 1, wherein said resin is made of silicon resin.

5. A stage particle removing method according to claim 1, wherein said silicone resin is a cross-linked silicon resin.

6. A stage particle removing method according to claim 1, wherein said stage has a suction mechanism, said method further comprising:

after said rigid cleaning plate is placed on the surface of said stage and before said rigid cleaning plate is withdrawn from said stage, said rigid cleaning plate is retained by suction to the surface of said stage, and said suction is then released.

7. A stage particle removing method according to claim 6, wherein said suction mechanism is a vacuum suction.

8. A stage particle removing method according to claim 6, wherein said suction mechanism is a suction by electrostatic force.

9. A stage particle removing method according to claim 8, wherein said stage is held in a depressurized environment.

10. A stage particle removing method according to claim 9, wherein said system is an electron-beam lithography system.

11. A stage particle removing method according to claim 1, wherein said rigid cleaning plate is transferred onto the surface of said stage and withdrawn from the surface of said stage by using same mechanisms which are used to transfer said workpiece onto the surface of said stage and to withdraw said workpiece from the surface of said stage.

12. A stage particle removing method for removing particles on a surface of a stage, which holds a planer workpiece, when implemented in a system for processing the planar workpiece, comprising:

providing a stage with a carrying surface;

providing a cleaning plate that is rigid and includes a resin film coated over at least one surface of the rigid cleaning plate, which cleaning plate is placed on the surface of said stage to contact the resin film with the carrying surface of said stage and any particles on the surface of said stage so the particles adhere to the resin film coating; and withdrawing said rigid cleaning plate from said stage to remove particles from said stage.

* * * * *

UNITED STATES PATENT AND TRADEMARK OFFICE
CERTIFICATE OF CORRECTION

| | | |
|---|---|---|
| PATENT NO. | : 6,565,419 B1 | Page 1 of 4 |
| APPLICATION NO. | : 09/497819 | |
| DATED | : May 20, 2003 | |
| INVENTOR(S) | : Nishio et al. | |

It is certified that error appears in the above-identified patent and that said Letters Patent is hereby corrected as shown below:

| | |
|---|---|
| Column 10, line 49, Claim 4 | Insert --film--, After "resin" (First occurrence) |
| Column 10, line 49, Claim 4 | Delete "silicon", Insert --silicone-- |
| Column 10, line 51, Claim 5 | Delete "silicon", Insert --silicone-- |

In the Drawings

Figure 8:
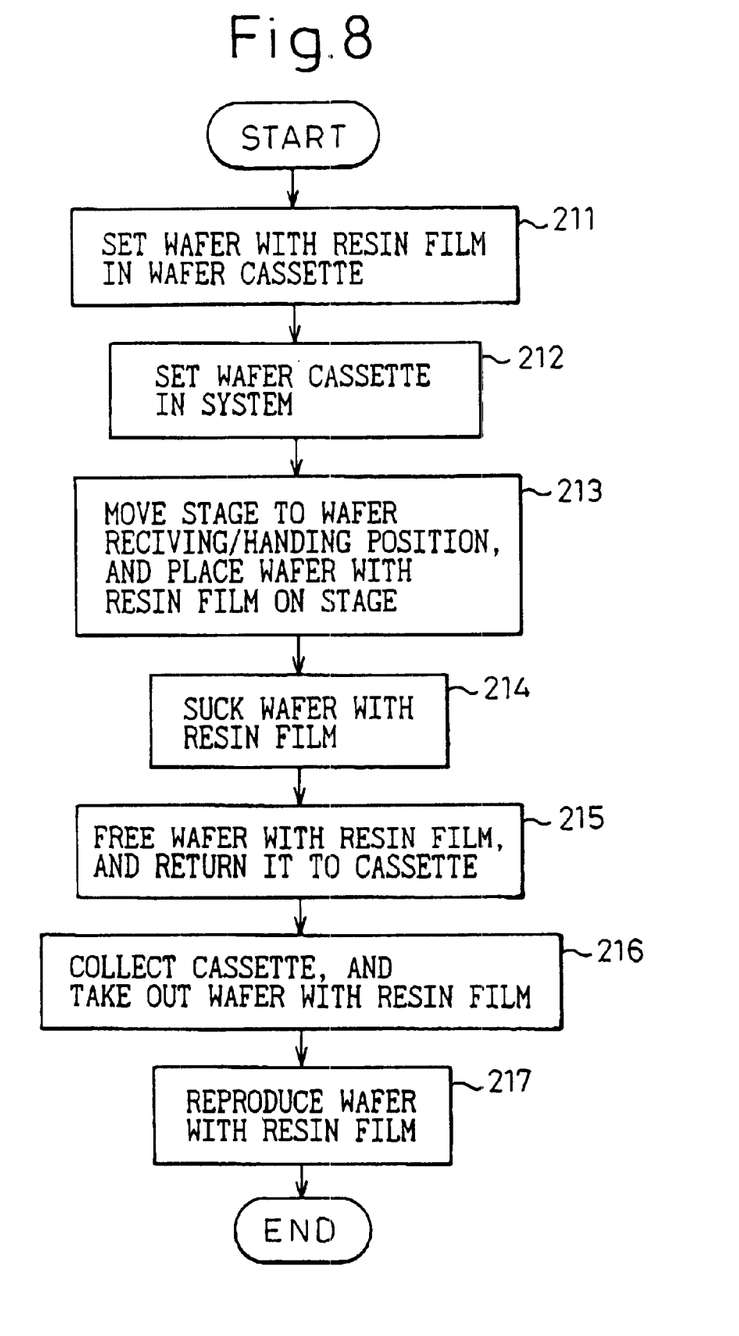
FIG. 8 is a flowchart describing a method of removing particles from the stage of the electron-beam lithography system using the cleaning wafer according to the present invention.

| | |
|---|---|
| FIGs. 1 & 2, Sheet 1 of 7 | Delete Drawing Sheet 1 and substitute therefore the Drawing Sheet, consisting of Figs. 1 & 2, as shown on the attached page |
| FIGs. 3A & 3B, Sheet 2 of 7 | Delete Drawing Sheet 2 and substitute therefore the Drawing Sheet, consisting of Figs. 3A & 3B, as shown on the attached page |
| FIG. 8, Sheet 6 of 7 | Delete Drawing Sheet 6 and substitute therefore the Drawing Sheet, consisting of Fig. 8, as shown on the attached page |

Signed and Sealed this

Twenty-first Day of November, 2006

JON W. DUDAS
*Director of the United States Patent and Trademark Office*

Fig.1

(PRIOR ART)

Fig.2

(PRIOR ART)